United States Patent [19]

Knickerbocker

[11] 4,150,867
[45] Apr. 24, 1979

[54] PRE-WIRED TERMINAL CONNECTING BLOCK

[75] Inventor: Robert H. Knickerbocker, Cheshire, Conn.

[73] Assignee: The Siemon Company, Watertown, Conn.

[21] Appl. No.: 845,602

[22] Filed: Oct. 26, 1977

Related U.S. Application Data

[63] Continuation-in-part of Ser. No. 507,972, Sep. 20, 1974, abandoned.

[51] Int. Cl.² .............................................. H01R 9/08
[52] U.S. Cl. .............................. 339/97 P; 339/125 R; 174/72 A; 361/426
[58] Field of Search ...................... 339/97 R, 97 P, 98, 339/99 R, 198 R, 198 G, 198 S, 198 P, 198 GA, 125 R; 174/72 A; 361/426, 428

[56] References Cited

U.S. PATENT DOCUMENTS 3,777,223  12/1973  Chandler et al. ................ 339/198 R

*Primary Examiner*—Gerald A. Dost

[57] ABSTRACT

There is disclosed a terminal connecting block and bracket assembly. The terminal connecting block contains a plurality of flat elongate electrically conductive elements. Each element in the block comprises a flat base portion and at least one pair of opposing insulating shearing contact fingers projecting from the base portion and integral therewith. The opposing contact fingers project upwardly from the terminal block. Each electrically conductive element also contains a tang projecting from the opposite end of the base portion. A plurality of the electrically conductive elements are in electrical contact with a unitary electrical connector, e.g., a male or female connector, by means of electrically conductive wires. One end of each wire is attached to one of said tangs and the other end of each wire is attached to the unitary electrical connector. The terminal connecting block is used in combination with a bracket for mounting the block on a surface. The bracket comprises two spaced apart elongate side portions and an elongate rear portion coextensive with the side portions. Each of the side portions is secured to opposite edges of the rear portion and is perpendicular thereto. The side portions also contains recesses and holes for mounting a unitary electrical connector. The rear portion contains a plurality of elongated slots or openings and holes to accept rear mounted unitary connectors. The front portion of the bracket is open. The bracket may be secured to the wall in a telephone equipment room or it may be mounted on a telephonic equipment distribution panel supported on a three-sided frame.

46 Claims, 11 Drawing Figures

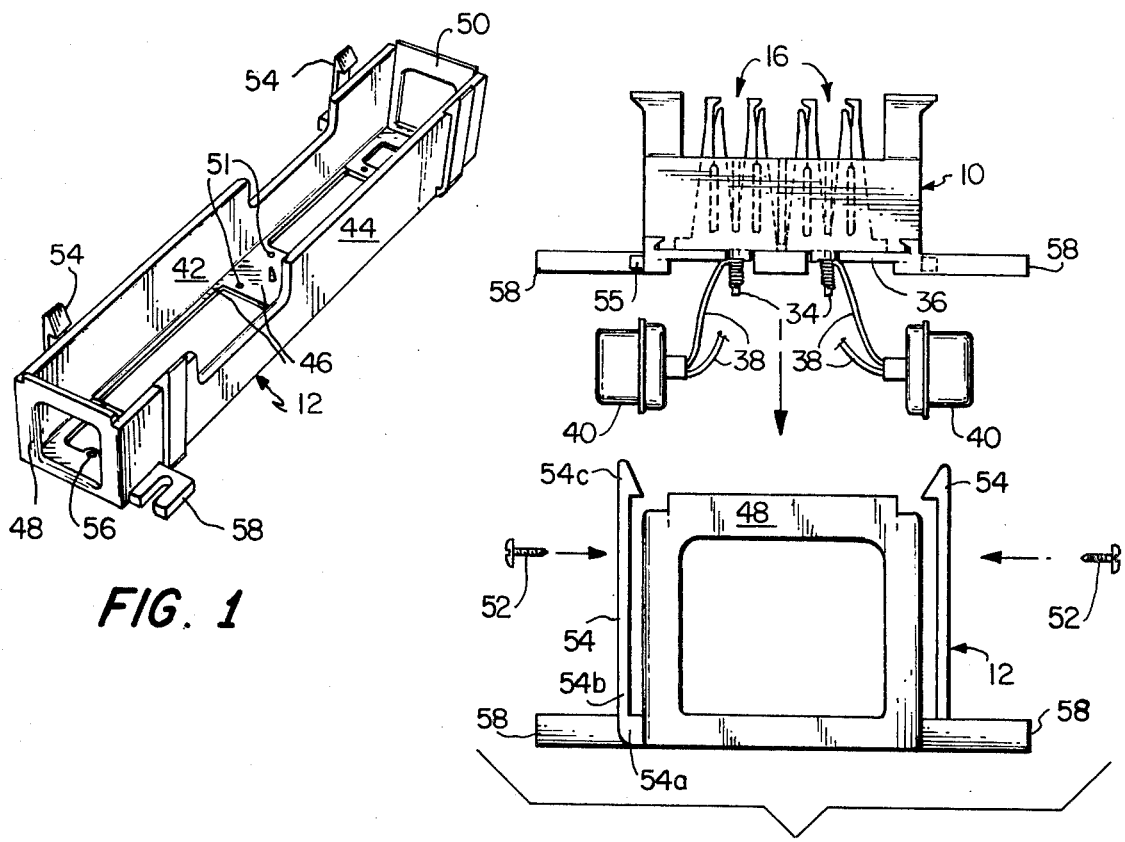
FIG. 1
FIG. 2
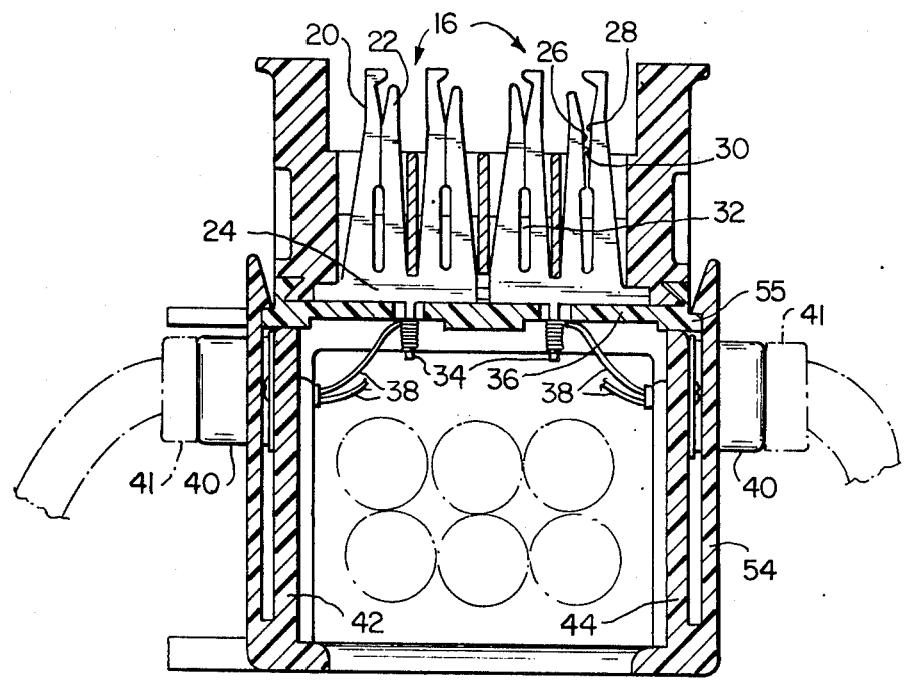
FIG. 4

PRE-WIRED TERMINAL CONNECTING BLOCK

CROSS REFERENCE TO RELATED APPLICATION

This application is a continuation-in-part of U.S. application Ser. No. 507,972 filed Sept. 20, 1974 and now abandoned.

BACKGROUND OF THE INVENTION (1) Field of the Invention

This invention relates to a pre-wired terminal connecting block suitable for forming interconnections among a large number of electrically conductive wires. More particularly, this invention relates to a pre-wired terminal connecting block and bracket assembly which is particularly useful in a telephone equipment room.

(2) Description of the Prior Art

Large numbers of terminal connecting blocks are used in the telephone industry, such as in a telephone equipment room which services all of the telephones on one floor of an office building. Such a block must provide relatively permanent but changeable interconnections among a large number of electrically conductive wires extending to a junction zone in a building in order to provide telephone service to various locations on that floor of the building. A cable containing a large number of telephone line conductor pairs is terminated at a terminal connecting block and additional wires go out from there, for example, to a key telephone set. Generally, in installing a telephone system in a building, the terminal connecting blocks are installed first and all of the various terminations and connections are then made manually. It would obviously be an advantage to reduce the number of cross connections which must be made manually in a telephone equipment room.

SUMMARY OF THE INVENTION

It is accordingly an object of this invention to provide a pre-wired terminal connecting block assembly for use in a telephone equipment room which will reduce the number of connections which must be made manually in the telephone equipment room. It is a further object of this invention to provide such a terminal connecting block in combination with a bracket for mounting the block on a flat surface or on a rack. It is another object of this invention to provide a pre-wired terminal block with standard unitary electrical connectors which can be used with one or more standard 25 pair cables, each attached to a unitary electrical connector that can mate with a unitary electrical connector on the block so that one end of the cable can be simply plugged into the block and the other end can be plugged into a standard 10 key phone, whereby with no further wiring it is in operating condition.

These and other objects are attained by the practice of this invention which, briefly, comprises providing a terminal connecting block containing a plurality of flat elongate electrically conductive elements. Each element in the block comprises a flat base portion and at least one pair of opposing insulating crushing or shearing contact fingers projecting from the base portion and integral therewith. The opposing contact fingers project upwardly from the terminal block. Each electrically conductive element also contains a tang projecting from the opposite end of the base portion. A plurality of the electrically conductive elements are in electrical contact with a unitary electrical connector, e.g., a male or female connector, by means of electrically conductive wires. One end of each wire is attached to one of said tangs and the other end of each wire is attached to the unitary electrical connector.

The terminal connecting block is preferably used in combination with a bracket for mounting the block on a surface. The bracket comprises two spaced apart elongate side portions and an elongate rear portion coextensive with the side portions. Each of the side portions is secured to opposite edges of the rear portion and is perpendicular thereto. The front portion of the bracket is open. In addition to many other specific details, the bracket has a plurality of elongated recesses in the side portions for receiving and mounting a plurality of unitary electrical connectors for pre-wiring.

The bracket may be secured to the wall in a telephone equipment room or, alternatively, in accordance with a more specific embodiment of this invention, it may be mounted on a telephonic equipment distribution panel supported on a three-sided frame. The frame comprises a base member supported on the floor of a building, an upright central post supported on the base member and a plurality of triangular-shaped members coupled to the post by means of radial arms the members being spaced along the post. Vertical members are attached to the corners of at least two of the triangular-shaped members and horizontal support members are attached to the vertical members. The terminal connecting block and bracket assembly is secured to the horizontal support members.

BRIEF DESCRIPTION OF THE DRAWING

This invention will be more particularly described with reference to the accompanying drawings wherein:

FIG. 1 is a perspective view of the bracket which is used in combination with the terminal connecting block;

FIG. 2 is an exploded end view of the pre-wired terminal connecting block and bracket assembly;

FIG. 4 is a sectional view taken along lines 4—4 of FIG. 3;

DESCRIPTION OF THE PREFERRED EMBODIMENTS

Referring more particularly to the drawings, there is shown a terminal connecting block designated generally as 10 and a bracket generally as 12. Both the block 10 and the bracket 12 may be formed of a suitable dielectric and self-extinguishing material, such as a phenol-formaldehyde resin or a polyvinyl resin.

Figure 3:
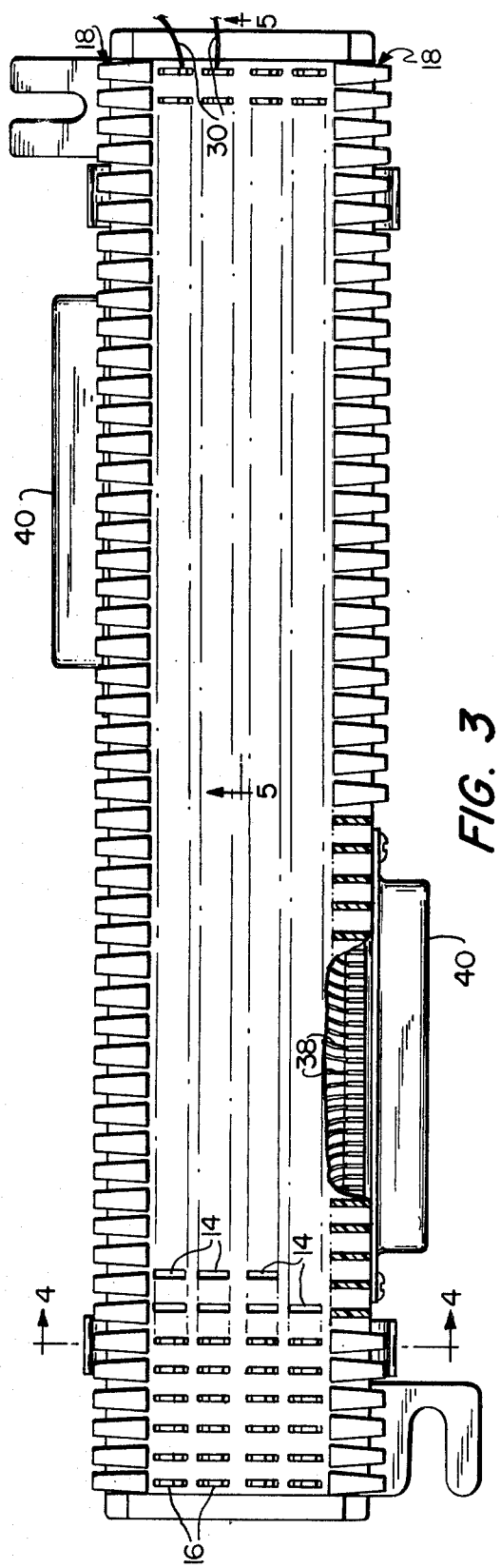
FIG. 3 is a top elevational view, partly in section, of the terminal connecting block and bracket assembly.

As best seen in FIG. 3, the block contains a number of slots which are adapted to receive a plurality of electrically conductive elements 16. The elements 16 may be constructed of any suitable resilient conductive material, such as phosphorbronze beryllium-copper or other known metal alloy. The block also contains a fanning strip 18 on each side thereof to keep separate the wires coming into or going out from the electrically conductive elements 16.

As best shown in FIG. 4, electrically conductive element 16 includes two pairs of opposing contact fingers 20 and 22 joined at one end to a base portion 24. Each pair of opposing contact fingers 20 and 22 forms a pair of mutually opposed edges 26 and 28 which shear or crush the insulation from an electrical conductor 30 (such as from a telephone central office) inserted therebetween. Although conductive elements 16 have been described as each having two pairs of opposing fingers 20 and 22, it will be understood that each element may have only one pair of the opposing fingers 20 and 22 or each may have more than two pairs of fingers depending on the particular requirements of any situation. Beneath the mutually opposed edges 26 and 28 and above the base portion 24 is a slot 32.

A tang 32 projects from the opposite end of the base portion 24 through holes in the bottom retaining plate 36 of the block 10. Each of the tangs 34 is connected to one end of an electrically conductive wire 38, such as by means of conventional wire wrapping apparatus. The other end of each electrically conductive wire 38 is attached to a unitary electrical connector 40. The rest of the wire is covered with insulation.

Figure 5:
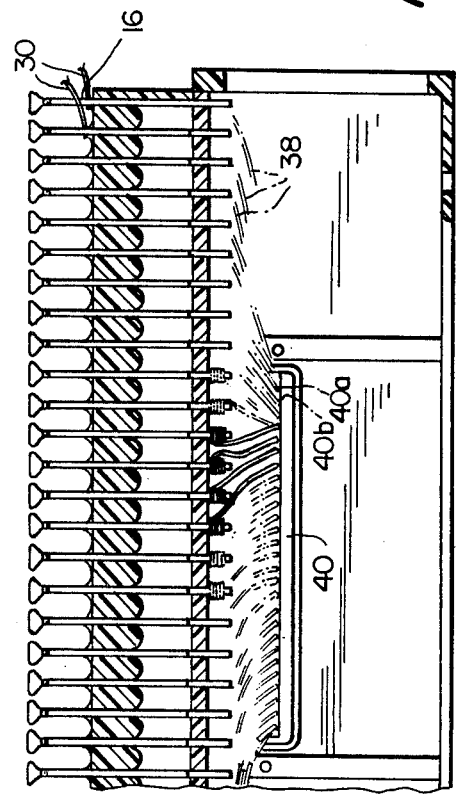
FIG. 5 is a sectional view taken along lines 5—5 of FIG. 3.
Figure 6:
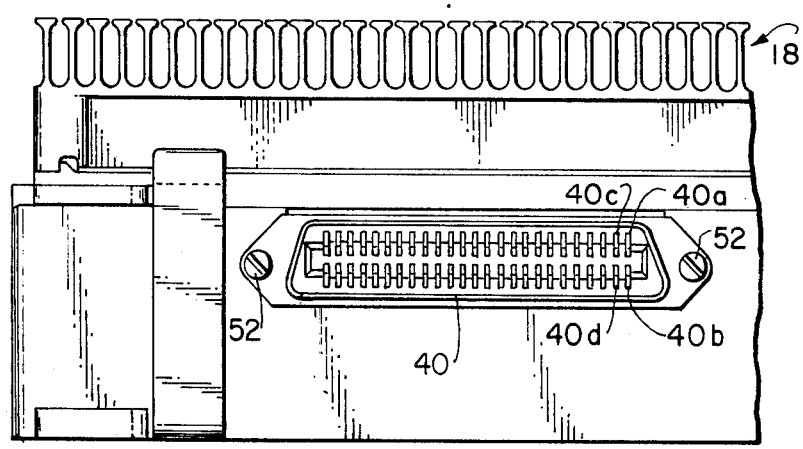
FIG. 6 is a partial side view of the terminal connecting block and bracket assembly.

As best shown in FIGS. 5 and 6, the unitary electrical connector 40 contains a plurality of electrical contact points 40a, 40b, 40c, 40d, etc., which are not in electrical connection with one another. Each electrical contact point, 40a, 40b, 40c, 40d, etc., is the termination point of one of the electrical conductive wires 38. Each electrical contact point is adapted to register with a contact point on a male or female connector 41, shown in phantom in FIG. 4, inserted into the male or female connector 40. The embodiment shown illustrates a fifty terminal female connector in which there are twenty-five electrical contact points on the bottom of the connector.

In the embodiment illustrated, the terminal connecting block contains two rows of side-by-side electrically conductive elements 16, each of which contains two sets of opposing fingers 20 and 22 and a tang 34. Accordingly, there are four longitudinal parallel rows of opposing contact fingers projecting from the top of the terminal connecting block and two parallel rows of tangs projecting from the bottom of the terminal connecting block. All of the electrically conductive wires attached to the tangs in one longitudinal row are attached to one male or female connector 40 and all of the electrically conductive wires attached to the tangs in the other longitudinal row are connected to an electrical connector 40 on the other side of the block 10. Thus, when each row contains fifty sets of elements 16, twenty-five conductor pairs may be terminated and/or connected by means of each row; and each row of elements is pre-wired to a fifty terminal male or female connector 40. It will be appreciated that one of the rows of elements 16 may be omitted in which case the block would be pre-wired to only one fifty terminal male or female connector. Conversely, up to three connectors may be wired to each row and a total of six connectors may be wired to each block, thus allowing six 10-key phones to be plugged in with no additional wiring with the bracket shown in FIG. 1.

The bracket 12 comprises two spaced apart elongate side portions 42 and 44 and an elongate rear portion 46 coextensive with the side portions 42 and 44. The side portions 42 and 44 are secured to opposite edges of the rear portion and are perpendicular thereto. The ends 48 and 50 of the bracket 12 are secured to the ends of the sides 42 and 44 and the rear 46. Each of the ends 48 and 50 contain apertures therein. The rear of the bracket 46 also contains two elongate apertures and up to eight holes 51 to allow up to four unitary connectors to be mounted thereon. As will be recognized by those skilled in the art, the number of unitary connectors that can be mounted on a bracket for pre-wiring will depend on the size of the bracket and the number of back or side openings or recesses to receive the connectors.

The bottom retaining plate 36 of the block 10 substantially covers the open front portion of the bracket 12 as shown in FIGS. 3 and 4. The tangs 34 and the electrically conductive wires 38 extend down into the space defined by the two elongate side portions 42 and 44 of the bracket 12. Each of the sides 42 and 44 contain a U-shaped recess in the top thereof in which is situated the male or female connectors 40. The male or female connectors are attached to the sides of the bracket by means of screws 52.

As seen in FIGS. 1, 2 and 4, there are four clamps 54 affixed to the bracket 12. Two clamps are secured to each side 42 and 44. Each clamp 54 comprises a base portion 54a which is integral with the bottom portion of the sides of the bracket, a leg portion 54b which is spaced apart from the side of the bracket, and a cap 54c which extends over the space between the side of the bracket and the leg 54b. The cap 54c is positioned above the top of the side of the clamp and mates with a projection 55 located on the bottom cover 36 of block 10, thereby holding the block 10 in contact with the bracket 12. The clamps 54 are resilient and by pulling the caps 54c in a direction away from the block, they will disengage from contact with the projections 55 thereby releasing the block 10.

The pre-wired bracket and block assembly may be attached to a suitable support means by placing either a screw or bolt through holes 56 located in each end of the rear of the bracket 46. One such hole 56 is shown in FIG. 1. Alternatively, the assembly may be secured to a support by means of mounting ears 58. One mounting ear 58 is located on the bottom of the side 44 and is integral therewith and another mounting ear 58 of the same shape is located on the bottom cover 36 of the block 10. Both of these two mounting ears are aligned with each other thus forming a pair of spaced apart mounting ears through which may be placed a bolt. Another set of mounting ears is situated on the other side 42 at the opposite end of the assembly.

Figure 7:
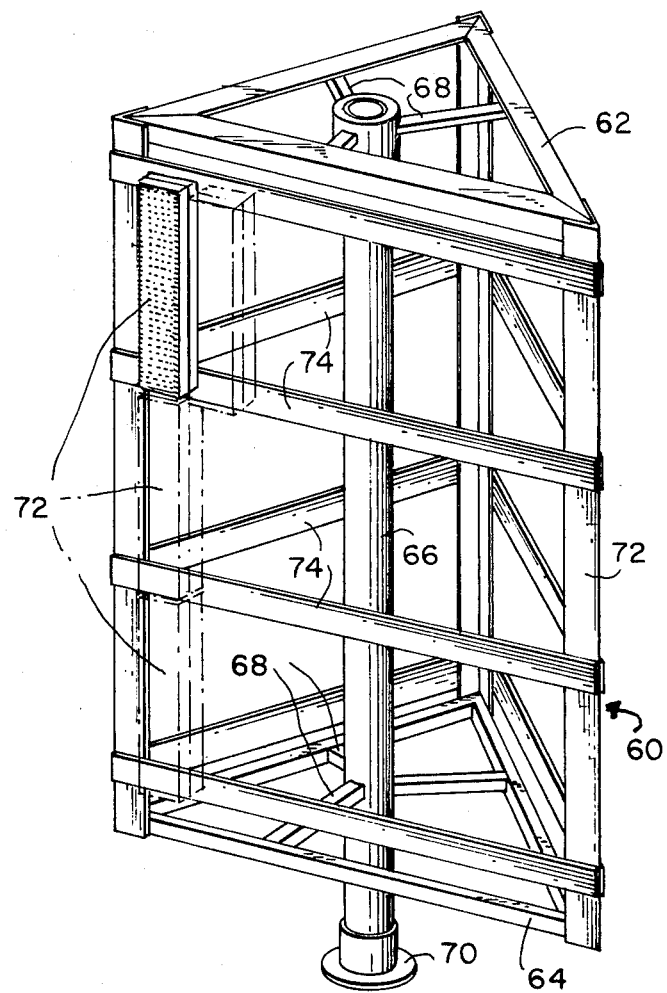
FIG. 7 is a perspective view of the combination electrical connecting block and bracket mounted on a three-sided telephonic equipment distribution panel.

FIG. 7 shows a tri-frame pedestal designated generally as 60 which may be used to support a plurality of the terminal block and bracket assemblies of this invention. The pedestal 60 comprises triangular frame members 62 and 64 which are secured to an upright, central post 66 by means of radial arms 68. The bottom of the post 66 is secured to a base member of flange 70. The flange 70 permits the frame 60 to be bolted to the floor. Each of the sides of support member 62 lies in the same substantially vertical plane as one of the sides of support members 64. Vertical angle irons 72 extend between each of the three corners on frames 62 and 64. Spaced apart horizontal support means 74 are coupled to the vertical angle irons 72. The block and bracket assembly of this invention is secured to the frame by fastening one end to one horizontal support means and the other end to the horizontal support means immediately above or beneath it. In the embodiment shown, three block and bracket assemblies are mounted end-to-end to form a row. A plurality of such rows may be mounted on each side of the frame. The openings at each end 48 and 50 of the brackets will accept up to six twenty-five pair cables (such cables being shown in phantom lines in FIG. 4). This provides concealment and protection for the cables. All the wires in a twenty-five pair cable may be terminated as previously described in one set of fifty electrically conductive elements 16.

The terminal block and bracket assembly of this invention may be pre-wired for connection with a ten-key telephone set or they may be mounted on racks in central office installations and in a PABX or PBX system.

Figure 8:
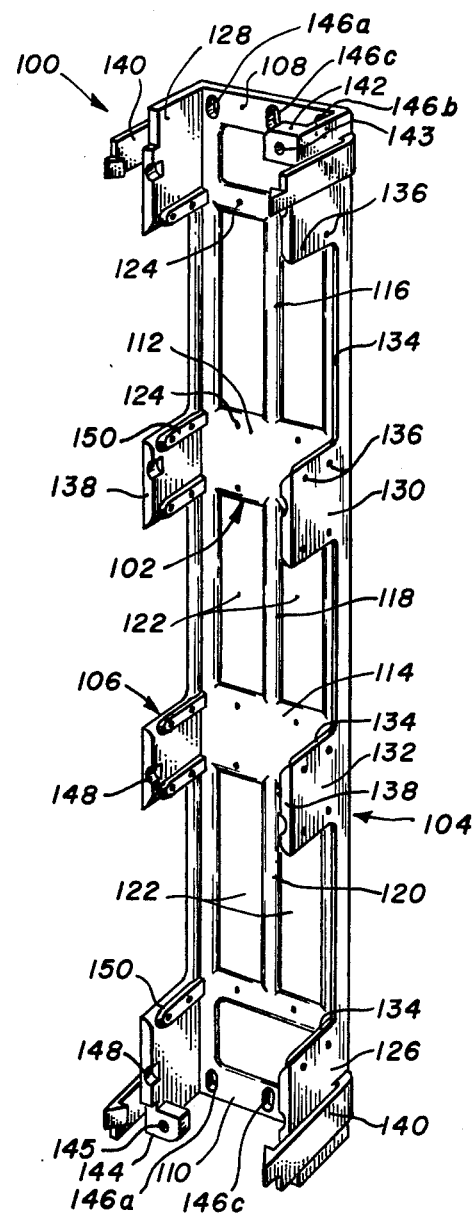
FIG. 8 is a perspective view of another embodiment of a bracket.
Figure 9:
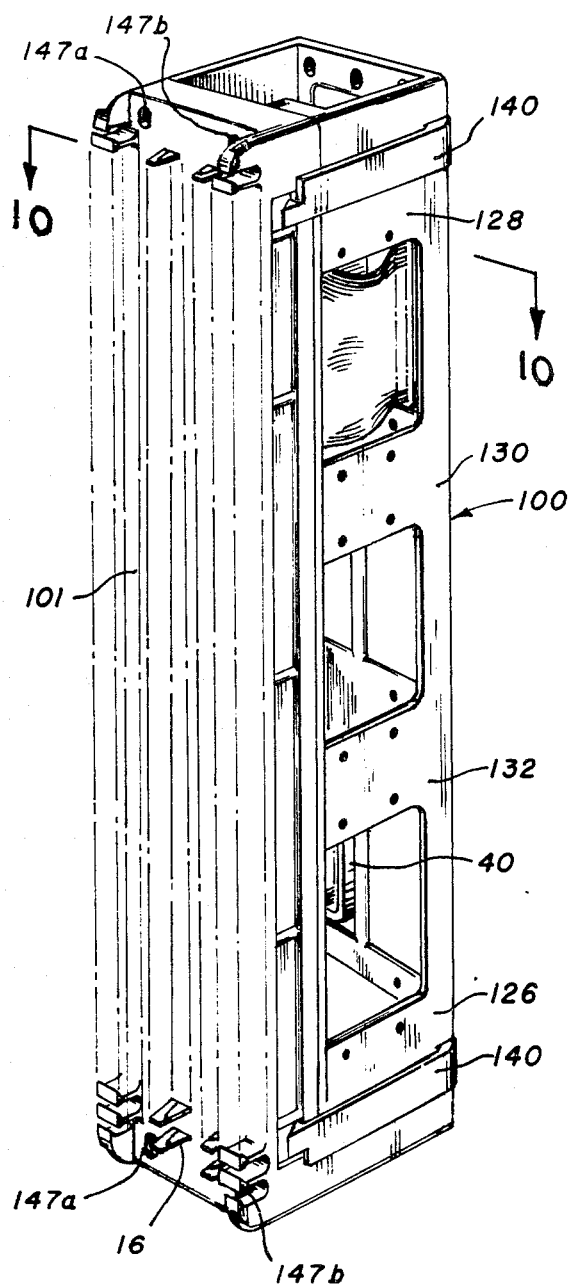
FIG. 9 is a partial view, in perspective of an assembly of a connecting block and the bracket of FIG. 8.

Referring now to FIGS. 8 and 9, another embodiment of a bracket in accordance with the present invention is shown. The bracket of FIGS. 8 and 9 is especially configured and suitable for mounting blocks which are known in the art as "B" blocks, and the bracket of FIGS. 8 and 9 will accept any presently known B block. The bracket 100 of FIG. 8 is formed of a rear portion, indicated generally at 102 and side portions indicated generally at 104 and 106. Rear portion 102 has end panels 108 and 110, intermediate divider panels 112 and 114 extending perpendicularly to the sides, and dividers 116, 118 and 120 extending perpendicular to end panels 108 and 110 and dividers 112 and 114. The dividers and end panels cooperate to define a plurality of openings 122 in the rear of the bracket, the openings being generally rectangular in shape to receive unitary connectors. A pair of mounting holes 124 is located at the opposite ends of each of the openings 122 for fastening the unitary connectors to the rear of the bracket by screw fasteners. Each side of the bracket has end panels 126 and 128 at opposite ends of the side, and each side also has intermediate dividers 130 and 132 so as to form three openings or recesses 134 along each side of the bracket. Although open at the front end of the bracket, the recesses 134 are generally rectangular in shape to receive unitary connectors, and mounting holes 136 are located at opposite ends of each recess to receive screw fasteners for mounting the unitary connectors in the recesses. As will be noted, there are two sets of mounting holes at the end of each recess so that the connectors can be staggered from one recess to the next above or below recess to accommodate the cable from the connector. In this manner, the cables can all lay flat along the sides of the bracket so that multiple bracket and block assemblies can be mounted close together side by side. Rear mounted connectors can also be staggered to clear cables from one row to the next; or T type connectors can be mounted on the rear to clear cable interference. Accordingly, the bracket shown in FIG. 8 is capable of carrying six back mounted unitary connectors and/or six side mounted unitary connectors or any combination thereof.

A connecting block 101 is mounted to bracket 100 by butting the block against the forward mounting surface 138 of each divider 130 and 132. Four resilient holding clamps 140 extend from the rear of the bracket and overlap the front of the bracket adjacent each end of the bracket. Clamps 140 are substantially identical to clamps 54 previously described except that they engage grooves on the side body of block 1, and clamps 140 serve to removably retain the connecting block to the bracket. Bearing in mind that a B block is of comparatively large size and comparatively heavy, end mounting tabs 142 and 144 are located at the front edge of diametrically opposed end panels 126 and 128. Each of the end tabs 142 and 144 has an opening 143 and 145 to receive a screw fastener which will pass through an appropriate opening in the connector block to fasten the connector block to the bracket. The tabs 142 and 144 serve to positively lock the connector block to the mounting bracket to prevent inadvertent disengagement of the block from the bracket. Although the block can no longer be disengaged from the bracket merely by flexing clamps 140 when the block is fastened at tabs 142 and 144, no substantial disadvantage is experienced in the principal configuration of the present invention wherein the block and bracket are pre-wired, since there is no need to repetitively dismount the block from the bracket for wiring purposes as was previously required.

A plurality of mounting holes 146a, 146b and 146c are provided at each end to mount the bracket for use. If the bracket is used in a non-pre-wired configuration, the bracket may be mounted on a panel or wall by fasteners in central mounting holes 146c. However, if the bracket is in a pre-wired assembly, holes 146b are not accessible for mounting. In that event, a pair of holes 147a and 147b in block 12 at each end are aligned with holes 146a and 146b when the block is mounted on the bracket, and fastening elements pass through the aligned holes 147a and 146a on one side and 147b and 146b on the other side of the prewired block and bracket assembly to mount the assembly. It will be noted that the opening 143 and 145 in tabs 142 and 144 are respectively aligned with a set of holes 147c and 146c at the top of the assembly and a set of holes 147a and 146a at the bottom, so that the fastening elements used to mount the pre-wired assembly will also pass through holes 143 and 145 in the mounting tabs 142 and 144 to lock the block to the bracket.

Figure 11:
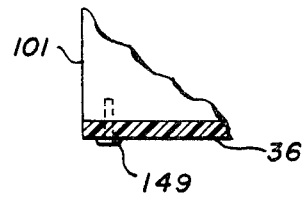
FIG. 11 is a partial view showing a detail of the block.

The rear or back retainer plate of a connector block (e.g. plate 36 of FIG. 4) is often fastened to the body of the connecting block 101 by means of screws fasteners of the general type shown at 149 in FIG. 11. The heads of these screw fasteners project beyond the rear plane of the retainer plate, so that the screw heads will extend beyond the rear of the mounting bracket when the block is mounted on the bracket. In order to accommodate these screw heads, a semi-cylindrical recess 148 is located in each of the end panels 126 and 128 and the dividers 130 and 132, with the recess 148 being on the innermost side of each element and intercepting the mounting surface 138. The recesses 148 are positioned so that the projecting fastener heads 147 on the back of the connector block mate with the recesses 148 and the fasteners 147 act as dowels to prevent end panels 126 and 128 and dividers 130 and 132 from flexing inwardly when pressure is applied to them to mount connectors.

As discussed with the previous embodiment, when the connector block is mounted on a bracket a passageway of generally rectangular cross-sectional shape is defined between the connecting block and the bracket. Cables, such as shown in phantom in FIG. 4, can be passed through that rectangular channel in addition to the individual wires from the unitary connectors to the tangs 34 of the conductor elements 16. The inner surface of each of the side end panels and dividers is provided with a thickened portion or strip 150 at the location of each of the mounting holes 136 so that the screw fasteners which mount the unitary connectors to the sides of the bracket do not extend into the interior of the bracket where they might come in contact with and break or wear the insulation to short circuit any of the wires in the interior channel of the bracket.

As will be apparent to those skilled in the art, particularly neat and orderly installation results from use of the present invention. In addition to the pre-wiring configuration where the conductors from the unitary connectors to the tangs 34 are all located in the interior channel of the assembly, the supply or main wires from central office, such as shown in phantom in FIG. 4, can also pass through the interior channel of the assembly rather than being on the panel board in a rather jumbled array as is often the case. Furthermore, field installation of equipment is greatly simplified, since installation is achieved merely by plugging into the unitary connectors or by punching onto the elements 16.

Of course, while the description has referred to the unitary connectors being connected to individual telephone stations and the conducting elements 16 connected to central station, it will also be understood that those connections can be reversed.

The pre-wired assembly of the present invention can also be used to cross connect cables for increased capacity; and auxiliary equipment such as telex installations can be directly and simply hooked up by connectors to the fingers of conducting elements 16.

Figure 10:
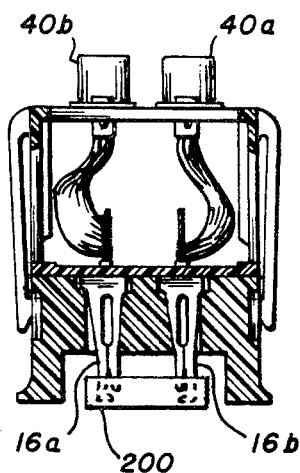
FIG. 10 is a sectional view of a pre-wired assembly for an interface block.

A particularly useful application for the pre-wired assembly of the present invention is as an interface block for customer added equipment. One such example is shown in FIG. 10 where one unitary connector is connected to one row of elements 16 and to central; another unitary connector is connected to the auxiliary equipment and to another row of elements 16; and the two rows of elements 16 are interconnected as by bridging bars. A complete interface block is thus realized, with the auxiliary equipment all connected and ready for use. This configuration is illustrated in FIG. 10 where connector 40a goes to central office and to conductors 15a; connector 40b goes to auxiliary equipment and to conductors 16b; and conductors 16a and 16b are bridged by conducting elements 162.

In an alternate configuration, only one unitary connector (40b) to the auxiliary equipment and to conductor 16a can be used. Then, instead of central office being connected to unitary connector 40a, central office lines (shown in phantom in FIG. 10) are punched into conductor 16b (which may be double pronged as in FIG. 4) and conducting element 162 bridges 16a and 16b.

While preferred embodiments have been shown and described, various modifications and substitutions may be made thereto without departing from the spirit and scope of the invention. Accordingly, it will be understood that the present invention has been described by way of illustration and not limitation.

What is claimed is:

1. A mounting bracket for terminal blocks the mounting bracket including:

an elongated rear portion having end panels and divider means between the end panels to define a plurality of openings in the rear portion to receive unitary connectors;

first and second spaced apart elongated side portions extending from said rear portion and being generally perpendicular thereto;

each of said side portions having a plurality of recesses to receive unitary connectors;

said side portions terminating at an open front portion of the bracket and defining mounting surfaces for receiving a terminal block; and mounting means for mounting the bracket on a support; and flexible clamps adjacent each end of each side portion for releaseably retaining a terminal block on the bracket.

2. A bracket as in claim 1 including:

end portions on said bracket at opposite ends thereof, the end portion being at least partly open to permit passage of wires between said side portions.

3. A bracket as in claim 1 wherein:

said openings in said rear portion and said openings in said side portions are generally rectangular in shape.

4. A bracket as in claim 1 wherein:

said divider means in said rear portion are divider panels, and said openings in said rear portion are generally rectangular openings; and said side portion includes divider panels, and said springs in said side portions are generally rectangular.

5. A bracket as in claim 4 wherein:

said end panels and divider panels of said rear portion define pairs of adjacent openings at longitudinally spaced apart stations along said rear portions.

6. A bracket as in claim 5 wherein:

said end panels and divider panels of said side portions define spaced apart recesses at longitudinally spaced apart stations corresponding to the spaced apart stations of said rear portions.

7. A bracket as in claim 1 including:

fastener receiving means at opposed end panel and divider panel locations adjacent each of said rear portion openings and side portions recesses; and thickened portions on said end panels and divider panels of said side portions at the locations of said fastener receiving means.

8. A bracket as in claim 1 including:

semi-cylindrical recesses in at least some of said end panels and dividers of said side portions.

9. A mounting bracket and terminal block assembly comprising:

(a) a mounting bracket including:

an elongated rear portion having end panels and divider panels between the end panels to define a plurality of rectangular openings in the rear portion;

first and second spaced apart elongated side portions extending from said rear portion and being generally perpendicular thereto;

each of said side portions having end panels and divider panels between said end panels to define a plurality of recess in each of said end panels;

said end panels and divider panels of said side portions terminating at an open front portion of the bracket and defining mounting surfaces for receiving a terminal block; and mounting means associated with opposed end panels of each of said side portions for mounting a terminal block to the bracket, and;

(b) at least one unitary electrical connector mounted on said bracket in an opening of said rear portion or a recess of said side portion; and (c) a terminal block mounting on said bracket and including:

a block body having a rear surface;

said block body cooperating with said end and side portions of said bracket to define a channel;

a plurality of conductor elements in said block body having portions extending through said rear surface and into said channel, and;

electrically conductive means in said channel connected between said extending portions and said unitary connector.

10. A mounting bracket and terminal block assembly as in claim 9 wherein:

said end panels and divider panels of said rear portion define pairs of adjacent openings at longitudinally spaced apart stations along said rear portions.

11. A mounting bracket and terminal block assembly as in claim 10 wherein:

said end panels and divider panels of said side portions define spaced apart recesses at longitudinally spaced apart stations corresponding to the spaced apart stations of said rear portions.

12. A mounting bracket and terminal block assembly as in claim 9 including:

semi-cylindrical recesses in at least some of said end panels and dividers of said side portions.

13. A mounting bracket and terminal block assembly as in claim 9 including:

fastener receiving means at opposed end panel and divider panel locations adjacent each of said rear portion openings and side portions recesses; and thickened portions on said end panels and divider panels of said side portions at the locations of said fastener receiving means.

14. A mounting bracket and terminal block assembly as in claim 9 wherein said mounting means includes:

flexible clamps adjacent each end of said side portions for releasably retaining a terminal block on the bracket; and said block includes:

projections for engaging said flexible clamps.

15. A mounting bracket and terminal block assembly as in claim 12 wherein said mounting means includes:

mounting surfaces having fastener receiving means.

16. A mounting bracket and terminal block assembly as in claim 9 including:

mounting openings in the rear portions of said bracket for mounting said bracket to a support; and mounting openings in said block aligned with said mounting openings in said bracket, said aligned mounting openings in said block and said bracket being adapted to receive fastener means for mounting the assembly to a support.

17. A mounting bracket and terminal block assembly as in claim 16 including:

at least one mounting tab on said bracket and having a tab opening aligned with a mounting opening on each of said block and bracket.

18. A mounting bracket and terminal block assembly as in claim 16 including:

a pair of said mounting tabs at diagonally opposed ends of said bracket, each tab having an opening aligned with a mounting opening on each of the block and bracket.

19. A pre-wired mounting bracket and terminal block assembly including:

(a) a terminal connecting block containing a plurality of electrically conductive elements, each element comprising a base portion and at least one pair of opposing contact fingers projecting in a first direction from said base portion and integral therewith, said elements being arranged such that the pair of opposing contact fingers are in a longitudinal row in said terminal connecting block, said opposing contact fingers projecting from the front of said terminal block, each of said conductive elements further comprising a tang projecting in a second direction from said base portion beyond the back of said terminal block;

(b) at least one unitary electrical connector, a plurality of said conductive elements being in electrical contact with said unitary electrical connector by means of electrically conductive wires, one end of each wire being attached to one of said tangs and the other end of each wire being attached to said unitary electrical connector; and (c) a bracket, said bracket comprising two spaced apart elongate side portions, an elongate rear portion coextensive with said side portions, each of said side portions being secured to opposite edges of said rear portion and being perpendicular thereto, the front portion of said bracket being open, the back of said terminal connecting block substantially covering the open front portion of said bracket and said tangs and said electrically conductive wires being situated between the two elongate side portions of said bracket, said unitary electrical connector being located in an opening in the rear or one of said elongate side portions of said bracket.

20. A pre-wired mounting bracket and terminal block assembly as in claim 19 wherein:

said electrically conductive elements are arranged in a plurality of parallel rows.

21. A pre-wired mounting bracket and terminal block assembly as defined in claim 19 wherein said connector is located in an opening in one of said elongate side portions of said bracket and is secured to said side portion.

22. A pre-wired mounting bracket and terminal block assembly as defined in claim 19 wherein said terminal connecting block contains a plurality of pairs of electrical conductive elements, said pairs being situated in side-by-side relationship in said block, thereby forming longitudinal parallel rows of opposing contact fingers in said terminal connecting block, and longitudinal parallel rows of tangs projecting through the bottom of said terminal connecting block and into the space between the two elongate side portions of said bracket and further comprising a plurality of male or female connectors situated in openings in the rear or side portions of said bracket and secured to said rear or side portion, each of the electrically conductive wires attached to the tangs in one longitudinal parallel row being connected to one of said male or female connectors and each of the electrically conductive wires attached to the tangs in another longitudinal row being attached to the other male or female connector.

23. A pre-wired mounting bracket and terminal block assembly as defined in claim 19 wherein a plurality of resilient clamping means are attached to the outside of the elongate side portions of said bracket, each said clamping means engaging a projection on said terminal connecting block, thereby holding said terminal connecting block in contact with said bracket.

24. A pre-wired interface block between central office and auxiliary equipment comprising:
(a) a mounting bracket including:
two spaced apart side portions;
a rear portion coextensive with said side portions, each of said side portions being secured to opposite edges of said rear portion and being perpendicular thereto;
(b) at least two unitary electrical connectors mounted on said bracket, one of said unitary connectors being adapted for connection to a source of signals and the other of said unitary connectors being adapted for connection to auxiliary equipment;
(c) a terminal block including:
a block body having at least first and second electric conducting elements having first and second portions extending in the front and back of said block, said terminal block being mounted on said bracket with the back of said block covering the front of said bracket and the side portions of said conducting elements extending between the side portions of the mounting bracket, first electrically conductive means between the first of said conducting elements and said one unitary connectors, second electrically conductive means between the second of said conducting elements and the other of said unitary connectors, and bridging means between said first portions of said conducting elements.

25. A pre-wired interface block as in claim 24 wherein each of said conducting elements include:
a base portion, at least a pair of contact fingers comprising said first portion, and a tang comprising said second portion.

26. A pre-wired interface block between central office and auxiliary equipment comprising:
(a) a mounting bracket including:
two spaced apart side portions;
a rear portion coextensive with said side portions, each of said side portions being secured to opposite edges of said rear portion and being perpendicular thereof;
(b) at least one unitary electrical connector mounted on said bracket, said unitary connector being adapted for connection to auxiliary equipment;
(c) a terminal block including:
a block body having at least first and second electric conducting elements having first and second portions extending in the front and back of said block, said terminal block being mounted on said bracket with the back of said block covering the front of said bracket and the side portions of said conducting elements extending between the side portions of the mounting bracket, first electrically conductive means between the first of said conducting elements and said one unitary connector, second electrically conductive means between the second of said conducting elements and a source of signals, and bridging means between said first portions of said conducting elements.

27. A pre-wired interface block as in claim 26 wherein each of said conducting elements include:
a base portion, at least a pair of contact fingers comprising said first portion, and a tang comprising said second portion.

28. In combination:
(a) a terminal connecting block containing a plurality of flat elongate electrically conductive elements, each element comprising a flat base portion and at least one pair of opposing insulation shearing contact fingers projecting from said base portion and integral therewith, said elements being arranged such that the pairs of opposing contact fingers are in longitudinal parallel rows in said terminal connecting block, said opposing contact fingers projecting upwardly from said terminal block, each said element further comprising a tang projecting from the opposite end of said base portion, a plurality of said elements being in electrical contact with a unitary electrical connector by means of electrically conductive wires, one end of each wire being attached to one of said tangs and the other end of each wire being attached to said unitary electrical connector, said unitary electrical connector being a plug-in type of connector adapted to frictionally receive and retain a mating plug-in type of connector, said unitary electrical connector being a connector containing a plurality of electrical contact points which are not in electrical connection with one another, each electrical contact point being the termination point of one of said electrical conductive wires and being adapted to register with a contact point on another electrical connector; and
(b) a bracket, said bracket comprising two spaced apart elongate side portions, an elongate rear portion coextensive with said side portions, each of said side portions being secured to opposite edges of said rear portion and being perpendicular thereto, the front portion of said bracket being open, the bottom of said terminal connecting block substantially covering the open front portion of said bracket and said tangs and said electrically conductive wires of said terminal connecting block being situated between the two elongate side portions of said bracket, said connector being located in an opening in one of said elongate side portions of said bracket.

29. A combination as defined in claim 28 wherein said terminal connecting block contains a plurality of flat elongate electrical conductive elements, said conductive elements being situated in side-by-side relationship in said block, thereby forming at least two longitudinal parallel rows of opposing contact fingers in said terminal connecting block, and at least two longitudinal parallel rows of tangs projecting through the bottom of said terminal connecting block and into the space between the two elongate side portions of said bracket and further comprising a male or female connector situated in an opening in each of said elongate side portions of said bracket and secured to said side portion, each of said electrically conductive wires attached to the tangs in one longitudinal parallel row being connected to one of said male or female connectors and each of the electrically conductive wires attached to the tangs in the other longitudinal row being attached to the other male or female connector.

30. A combination as defined in claim 29 wherein each row of terminals contains fifty terminals which are pre-wired to a standard fifty terminal male or female connector.

31. A combination as defined in claim 28 wherein said terminal connecting block contains a single row of flat elongate electrical conductive elements, thereby forming a longitudinal row of opposing contact fingers in said terminal connecting block and one longitudinal row of tangs projecting through the bottom of said terminal connecting block and into the space between the two elongate side portions of said bracket and further comprising a male or female connector situated in an opening in one of said elongate side portions of said bracket and secured to said side portion, each of the electrically conductive wires attached to the tangs in said row being connected to said male or female connector.

32. A combination as defined in claim 31 wherein said row contains fifty terminals which are pre-wired to a fifty terminal male or female connector.

33. A combination as defined in claim 28 wherein a plurality of resilient clamping means are attached to the outside of the elongate side portions of said bracket, each said clamping means engaging a projection on the bottom of said terminal connecting block, thereby holding said terminal connecting block in contact with said bracket.

34. A telephonic equipment distribution panel assembly comprising a base member supported on the floor of a building, an upright central post supported on the base member and a plurality of triangular members coupled to the post by means of radial arms, said members being spaced along said post, vertical members being attached to the corners of the triangular-shaped members, spaced-apart horizontal support members being attached to said vertical members and a plurality of combination terminal blocks and brackets as defined in claim 28 mounted on said panel.

35. In combination:
(a) a terminal connecting block containing a plurality of electrically conductive elements, each element comprising a base portion and at least one pair of opposing contact fingers projecting from said base portion and integral therewith, said elements being arranged such that the pairs of opposing contact fingers are in longitudinal rows in said terminal connecting block, said opposing contact fingers projecting upwardly from said terminal block, each said element further comprising a tang projecting from the opposite end of said base portion, a plurality of said elements being in electrical contact with a unitary electrical connector by means of electrically conductive wires, one end of each wire being attached to one of said tangs and the other end of each wire being attached to said unitary electrical connector; and
(b) a bracket, said bracket comprising two spaced apart elongate side portions, an elongate rear portion coextensive with said side portions, each of said side portions being secured to opposite edges of said rear portion and being perpendicular thereto, the front portion of said bracket being open, the bottom of said terminal connecting block substantially covering the open front portion of said bracket and said tangs and said electrically conductive wires of said terminal connecting block being situated between the two elongate side portions of said bracket, said connector being located in an opening in one of said elongate side or back portions of said bracket.

36. A combination as defined in claim 35 wherein said terminal connecting block contains a plurality of flat elongate electrical conductive elements, said conductive elements being situated in side-by-side relationship in said block, thereby forming at least two longitudinal parallel rows of opposing contact fingers in said terminal connecting block, and at least two longitudinal parallel rows of tangs projecting through the bottom of said terminal connecting block and into the space between the two elongate side portions of said bracket and further comprising a male or female connector situated in an opening in each of said elongate side portions of said bracket and secured to said side portion, each of said electrically conductive wires attached to the tangs in one longitudinal parallel row being connected to one of said male or female connectors and each of the electrically conductive wires attached to the tangs in the other longitudinal row being attached to the other male or female connector.

37. A combination as defined in claim 36 wherein each row of terminals contains fifty terminals which are pre-wired to a standard fifty terminal male or female connector.

38. A combination as defined in claim 35 wherein said terminal connecting block contains a single row of flat elongate electrical conductive elements, thereby forming a longitudinal row of opposing contact fingers in said terminal connecting block and one longitudinal row of tangs projecting through the bottom of said terminal connecting block and into the space between the two elongate side portions of said bracket and further comprising a male or female connector situated in an opening in one of said elongate side portions of said bracket and secured to said side portion, each of the electrically conductive wires attached to the tangs in said row being connected to said male or female connector.

39. A combination as defined in claim 38 wherein said row contains fifty terminals which are pre-wired to a fifty terminal male or female connector.

40. A combination as defined in claim 35 wherein a plurality of resilient clamping means are attached to the outside of the elongate side portions of said bracket, each said clamping means engaging a projection on the bottom of said terminal connecting block, thereby holding said terminal connecting block in contact with said bracket.

41. In combination:
(a) a terminal connecting block containing a plurality of flat elongate electrically conductive elements, each element comprising a flat base portion and two separate pairs of opposing insulation shearing contact fingers projecting from said base portion and integral therewith, said elements being arranged such that the pairs of opposing contact fingers are in longitudinal parallel rows in said terminal connecting block, said opposing contact fingers projecting upwardly from said terminal block, each said element further comprising a tang projecting from the opposite end of said base portion, a plurality of said elements being in electrical contact with a unitary electrical connector by means of electrically conductive wires, one end of each wire being attached to one of said tangs and the other end of each wire being attached to said unitary electrical connector, said unitary electrical connector being a plug-in type of connector adapted to frictionally receive and retain a mating plug-in type of connector, said unitary electrical connector being a connector containing a plurality of electrical contact points which are not in electrical connection with one another, each electrical contact point being the termination point of one of said electrical conductive wires and being adapted to register with a contact point on another electrical connector, and (b) a bracket, said bracket comprising two spaced apart elongate side portions, an elongate rear portion co-extensive with said side portions, each of said side portions being secured to opposite edges of said rear portion and being perpendicular thereto, the front portion of said bracket being open, the bottom of said terminal connecting block substantially covering the open front portion of said bracket and said tangs and said electrically conductive wires of said terminal connecting block being situated between the two elongate side portions of said bracket, said connector being located in an opening in one of said elongate side portions of said bracket.

42. A combination as defined in claim 41 wherein said terminal connecting block contains a plurality of pairs of two flat elongate electrical conductive elements, said pairs being situated in side-by-side relationship in said block, thereby forming four longitudinal parallel rows of opposing contact fingers in said terminal connecting block, and two longitudinal parallel rows of tangs projecting through the bottom of said terminal connecting clock and into the space between the two elongate side portions of said bracket and further comprising a male or female connector situated in an opening in each of said elongate side portions of said bracket and secured to said side portion, each of the electrically conductive wires attached to the tangs in one longitudinal parallel row being connected to one of said male or female connectors and each of the electrically conductive wires attached to the tangs in the other longitudinal row being attached to the other male or female connector.

43. A combination as defined in claim 42 wherein each row of terminals contains fifty terminals which are pre-wired to a standard fifty terminal male or female connector.

44. A combination as defined in claim 41 wherein said terminal connecting block contains a single row of flat elongate electrical conductive elements, thereby forming two longitudinal parallel rows of opposing contact fingers in said terminal connecting block and one longitudinal parallel row of tangs projecting through the bottom of said terminal connecting block and into the space between the two elongate side portions of said bracket and further comprising a male or female connector situated in an opening in one of said elongate side portions of said bracket and secured to the said side portion, each of the electrically conductive wires attached to the tangs in said row being connected to said male or female connector.

45. A combination defined in claim 44 wherein said row contains fifty terminals which are pre-wired to a fifty terminal male or female connector.

46. A combination as defined in claim 41 wherein a plurality of resilient clamping means are attached to the outside of the elongate side portions of said bracket, each said clamping means engaging a projection on the bottom of said terminal connecting block, thereby holding said terminal connecting block in contact with said bracket.

* * * * *